United States Patent
Hung et al.

(10) Patent No.: US 9,281,290 B2
(45) Date of Patent: Mar. 8, 2016

(54) BOND HEAD FOR THERMAL COMPRESSION DIE BONDING

(75) Inventors: Kin Yik Hung, Kwai Chung (HK); Pak Kin Leung, Kwai Chung (HK); Cheuk Wah Tang, Kwai Chung (HK); Chi Ping Hung, Kwai Chung (HK); Gary Peter Widdowson, Hong Kong (HK)

(73) Assignee: ASM TECHNOLOGY SINGAPORE PTE LTD, Singapore (SG)

( * ) Notice: Subject to any disclaimer, the term of this patent is extended or adjusted under 35 U.S.C. 154(b) by 846 days.

(21) Appl. No.: 13/561,241

(22) Filed: Jul. 30, 2012

(65) Prior Publication Data

US 2014/0027068 A1   Jan. 30, 2014

(51) Int. Cl.
*B32B 37/00* (2006.01)
*H01L 23/00* (2006.01)
*B32B 38/18* (2006.01)

(52) U.S. Cl.
CPC ............. *H01L 24/75* (2013.01); *B32B 38/1858* (2013.01); *B32B 2457/14* (2013.01); *H01L 2224/7531* (2013.01); *H01L 2224/75252* (2013.01); *H01L 2224/75745* (2013.01); *H01L 2224/80203* (2013.01); *H01L 2224/81203* (2013.01); *H01L 2224/83203* (2013.01)

(58) Field of Classification Search
CPC ................................ H01L 27/74; H01L 24/75
USPC ....................... 156/580, 581, 583.1
See application file for complete search history.

(56) References Cited

U.S. PATENT DOCUMENTS

| 4,634,043 | A | * | 1/1987 | Avedissian | ............... 228/180.21 |
| 4,875,279 | A | * | 10/1989 | Sakiadis | ........................ 29/740 |
| 5,169,196 | A | * | 12/1992 | Safabakhsh | ................. 294/64.3 |
| 6,321,971 | B1 | * | 11/2001 | Jin et al. | ........................ 228/6.2 |

FOREIGN PATENT DOCUMENTS

JP   2003-303856   * 10/2003
JP   2012-129300   * 7/2012

* cited by examiner

*Primary Examiner* — James Sells
(74) *Attorney, Agent, or Firm* — Ostrolenk Faber LLP

(57) ABSTRACT

A bond head for thermal compression die bonding comprises a collet operative to support a die on a first side of the collet during die bonding and a bond head heater located on a second side of the collet opposite to the first side for heating the collet and the die. A die vacuum suction hole on the bond head heater applies a vacuum suction force to hold the collet, and a collet vacuum suction hole on the bond head heater applies a vacuum suction force to hold the die. At least one vacuum distribution channel that is formed on the second side of the collet is in fluid communication with the collet vacuum suction hole and distributes the vacuum suction force across a surface of the second side of the collet for securing the collet.

13 Claims, 2 Drawing Sheets

BOND HEAD FOR THERMAL COMPRESSION DIE BONDING

FIELD OF THE INVENTION

The invention relates to the bonding of semiconductor chips or dice to substrates, and in particular to a bond head comprising a heater and collet that is used to bond semiconductor dice to the substrates during die bonding operations.

BACKGROUND AND PRIOR ART

In semiconductor device manufacturing involving semiconductor die bonding, it is common to change a collet of a bond head used for pick-and-place operations when bonding a die with a different size. This is to ensure that a collet of a correct size is utilized to hold the die securely when conducting such die bonding operations. A typical method to mount a changeable collet to a bond head mount is by vacuum suction of the collet to the bond head mount. Conventionally, there has been no concern with a surface area of the collet which interfaces with the bond head mount being the same size as a corresponding interface on the bond head mount. Usually, it is possible to maintain the same interface surface area for the collet to the bond head mount as the collet has a protruding area that is used to support the die. Thus, only a perimeter of the protruding area needs to be changed to support different die sizes, whereas the collet itself does not require any dimensional change for connection to the bond head mount.

FIG. 1 is an isometric view of a prior art bond head heater 100 of a bond head used for picking up semiconductor dice and to perform die bonding. A collet (not shown) is attached to the bond head heater 100 such that a die may be heated when it is being held by the collet. As can be seen from FIG. 1, the bond head heater 100 comprises a collet vacuum hole 102 and vacuum grooves 106 connected to the collet vacuum hole 102 for spreading a vacuum suction force over a wider area when attaching a collet. Thus, the collet vacuum hole 102 and vacuum grooves 106 are both incorporated into the bond head heater 100. There is also a die vacuum hole 104 providing a vacuum suction force for holding a die.

This prior art bond head heater 100 is designed so that a flat collet can be held by vacuum suction throughout the locations of the vacuum grooves 106. Hence, with the existing design, collets having multiple sizes are attachable to the bond head heater 100. However, the vacuum system comprising the vacuum grooves 106 becomes unnecessarily complicated.

Moreover, some thermal compression die bonding operations involve extremely rapid temperature changes. In order to achieve such rapid temperature changes, there is a need to reduce a thermal mass of the collet. One way to produce a collet with lower thermal mass is to reduce a volume of the base material of the collet.

The prior art bond head heater 100 which includes the collet vacuum hole 102 and vacuum grooves 106 incorporated into it requires the collet that is attached to it to have one or more predetermined collet interface surface areas. If differently-sized collet interfaces are to be used, more than one vacuum groove 106 is typically required, such that a few rings of vacuum grooves 106 should be formed, as illustrated in FIG. 1. A disadvantage of this approach is that more than one vacuum groove 104 is required to enable the bond head heater 100 to hold collets of different sizes. Even then, only a limited number of collet sizes are allowed depending on the number of rings formed, such that three rings of vacuum grooves 104 generally only allow for three different collet sizes to be attached. Furthermore, with the fixed vacuum area on the heater, it is not easy to maintain a contact area ratio to generate a sufficiently high heat flux for rapid heating of silicon dice, particularly for smaller collets.

SUMMARY OF THE INVENTION

Thus, it is an object of the invention to seek to provide a bond head design which allows collets of different sizes to be attachable without substantially weakening a performance of the bond head as experienced in the prior art.

According to a first aspect of the invention, there is provided a bond head for thermal compression die bonding, comprising: a collet operative to support a die on a first side of the collet during die bonding; a bond head heater located on a second side of the collet opposite to the first side for heating the collet and the die; a die vacuum suction hole on the bond head heater that is operative to apply a vacuum suction force to hold the collet, and a collet vacuum suction hole on the bond head heater that is operative to apply a vacuum suction force to hold the die; and at least one vacuum distribution channel formed on the second side of the collet that is in fluid communication with the collet vacuum suction hole, said at least one vacuum distribution channel being operative to distribute the vacuum suction force across a surface of the second side of the collet for securing the collet.

According to a second aspect of the invention, there is provided a collet for a bond head for thermal compression die bonding, the collet comprising: a first side operative to support a die during die bonding; a second side opposite to the first side for coupling the collet to a bond head heater which is configured to heat the collet and the die, the bond head heater having a die vacuum suction hole that is operative to apply a vacuum suction force to hold the collet, and a collet vacuum suction hole that is operative to apply a vacuum suction force to hold the die; at least one vacuum distribution channel formed on the second side of the collet that is arranged for fluid communication with the collet vacuum suction hole, said at least one vacuum distribution channel being operative to distribute the vacuum suction force across a surface of the second side of the collet for securing the collet.

It would be convenient hereinafter to describe the invention in greater detail by reference to the accompanying drawings which illustrate one preferred embodiment of the invention. The particularity of the drawings and the related description is not to be understood as superseding the generality of the broad identification of the invention as defined by the claims.

BRIEF DESCRIPTION OF THE DRAWINGS

The present invention will be readily appreciated by reference to the detailed description of the preferred embodiment of the invention when considered with the accompanying drawings, in which.

DETAILED DESCRIPTION OF THE PREFERRED EMBODIMENT OF THE INVENTION

Figure 1:
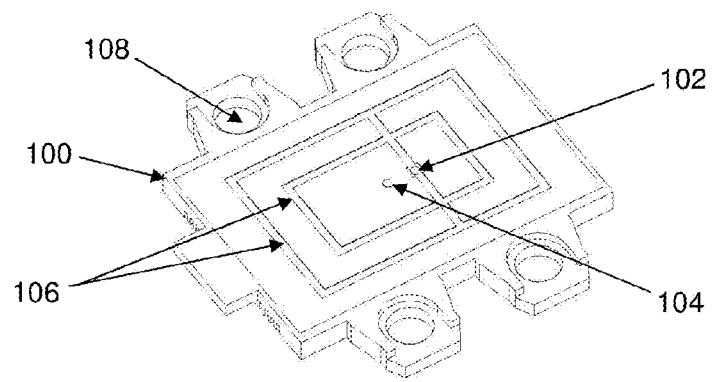
FIG. 1 is an isometric view of a prior art bond head heater of a bond head used for picking up semiconductor dice and to perform die bonding.
Figure 2:
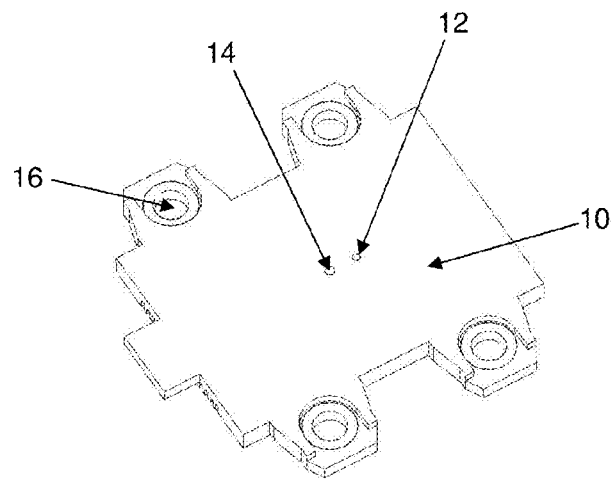
FIG. 2 is an isometric view of a bond head heater which does not incorporate any vacuum grooves on its surface and which may be used in the preferred embodiment of the invention.

FIG. 2 is an isometric view of a bond head heater 10 which does not incorporate any vacuum grooves on its surface and which may be used in the preferred embodiment of the invention. The bond head heater 10 comprises a plate that is operative to generate heat to a die (not shown) which is supported by a collet 18 (see FIG. 3) that is attachable to the bond head heater 10. Further, a plurality of screw holes 16 are formed in the bond head heater 10 for attaching the bond head heater 10 to a bond head.

The bond head heater 10 comprises two vacuum suction holes 12, 14. A collet vacuum suction hole 12 serves the function of applying a vacuum suction force for securing the collet 18 to the bond head heater 10, whereas a die vacuum suction hole 14 serves the function of applying a vacuum suction force for attracting a die to the collet 18 and the bond head heater 10. According to this design, only two vacuum suction holes are required on the bond head heater 10. Hence, a complicated vacuum system that is connected to the collet vacuum suction hole 12 on a surface of the bond head heater 10 can be avoided.

Figure 3:
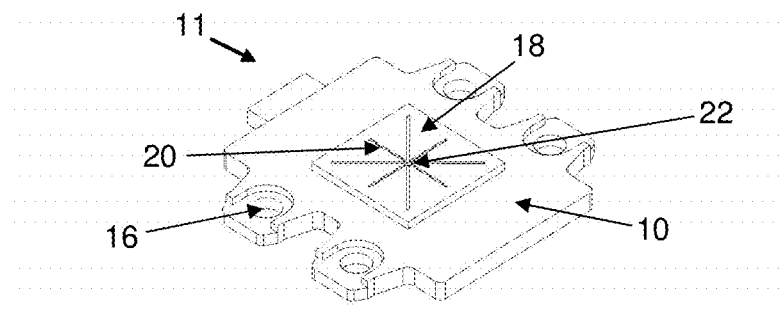
FIG. 3 is an isometric view of a bond head comprising a collet coupled to the bond head heater according to the preferred embodiment of the invention.

FIG. 3 is an isometric view of a bond head 11 comprising a collet 18 coupled to the bond head heater 10 according to the preferred embodiment of the invention. The collet 18 has opposite first and second sides. The first side of the collet 18 is used as a support surface for supporting a die when the die is being transported and bonded. It includes a network of vacuum grooves 20 and a central suction hole 22 which is in fluid communication with the network of vacuum grooves 20. The network of vacuum grooves 20 distributes a vacuum suction force over an increased surface area of the die as compared to relying only on the central suction hole 22 in order to achieve better vacuum support. The pattern of the network of vacuum grooves 20 is customizable, for example, by selecting a collet 18 with a larger or a smaller network if a size of a die to be held by the collet 18 is different. The central suction hole 22 is aligned with the die vacuum suction hole 14 of the bond head heater 10 to connect the network of vacuum grooves 20 to the die vacuum suction hole 14. A vacuum suction force is generated from a gas outlet connected to the die vacuum suction hole 14.

Figure 4:
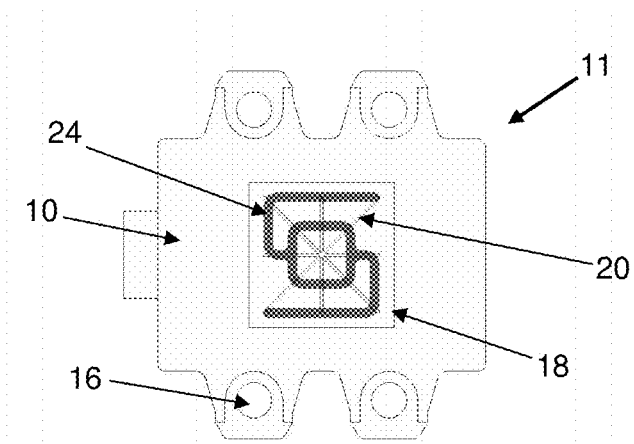
FIG. 4 is a plan view of the collet attached to the bond head heater, which shows vacuum grooves on both planar sides of the collet superimposed on each other.

FIG. 4 is a plan view of the collet 18 attached to the bond head heater 10, which shows vacuum grooves on both planar sides of the collet 18 superimposed on each other for illustration purposes. Vacuum grooves in the form of one or more vacuum distribution channels 24 are formed and patterned on the second side of the collet 18 that is in contact with a surface of the bond head heater 10 for heating the collet 18 and the die. These vacuum distribution channels 24 are utilized for the picking up as well as securing of the collet 18 by the bond head heater 10. In thermal compression bonding, the collet 18 should preferably be in direct contact with the bond head heater 10 in order to conduct heat generated by a pulse heater incorporated in the bond head heater 10.

The vacuum distribution channels 24 are in fluid communication with the collet vacuum hole 12 so as to distribute a vacuum suction force from the collet vacuum hole 12 to a larger surface area of the collet 18. This distributed vacuum suction force serves to attach the collet 18 more securely to the bond head heater 10.

Figure 5:
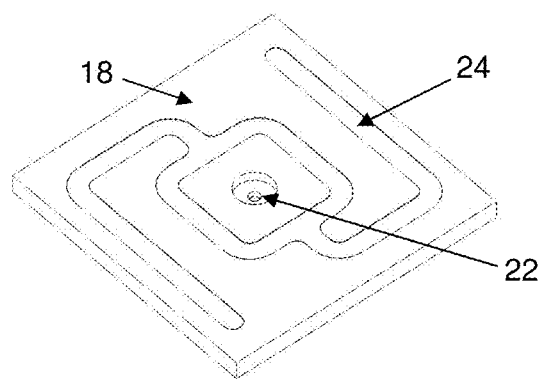
FIG. 5 is an isometric view of a reverse surface of the collet which is coupled to the bond head heater, including vacuum grooves formed on the said surface.

FIG. 5 is an isometric view of the second side of the collet 18 which is coupled to the bond head heater 10, including vacuum grooves in the form of vacuum distribution channels 24 formed on the said second side. The vacuum distribution channels 24 surround but are separate from the central suction hole 22 of the collet 18 and preferably extend close to the edges of the collet 18 to ensure increased distribution of a vacuum suction force from the collet vacuum hole 12 for securing the collet 18 onto the bond head heater 10.

It should be appreciated that in the bond head 11 comprising the bond head heater 10 and collet 18 according to the preferred embodiment of the invention, the vacuum grooves in the form of vacuum distribution channels 24 for holding the collet 18 is incorporated onto the collet 18 itself. Unlike in the prior art, they are not incorporated on the bond head heater 10, which includes a pulse heater. Therefore, different vacuum distribution channels 24 may be provided for different collets 18 to improve the effectiveness of the collet holding force. Whilst the prior art required vacuum grooves to be incorporated on the bond head heater 10, only vacuum holes 12, 14 on the bond head heater 10 are required for holding different collets 18 in the bond head 11 according to the preferred embodiment of the invention.

An advantage of this design is that the same ratio of vacuum area to overall area of the collet 18 is maintainable for different collet sizes. This ratio is important to balance a heat transfer through an interface of the bond head heater 10 and the collet 18 as well as to maintain the holding force.

Another advantage is that, if a small die is to be bonded, an equivalently small collet 18 can be used so as to reduce material used on a periphery of the collet 18. Moreover, smaller collets 18 may be used in such circumstances without changing the whole bond head, or at least there is no need to change the bond head heater 10 that is in contact with the collet 18. A same size of bond head heater 10 can be used as there are only vacuum holes incorporated on the heater without the presence of fixed-sized vacuum grooves to provide a vacuum suction force. Accordingly, the bond head heater 10 is easier to manufacture, whilst the changeable collet 18 may be custom-made at a relatively lower cost for catering to different die sizes.

The invention described herein is susceptible to variations, modifications and/or additions other than those specifically described and it is to be understood that the invention includes all such variations, modifications and/or additions which fall within the spirit and scope of the above description.

The invention claimed is:

1. A bond head for thermal compression die bonding, comprising:
   a collet operative to support a die on a first side of the collet during die bonding;
   a bond head heater located on a second side of the collet opposite to the first side for heating the collet and the die;
   a die vacuum suction hole on the bond head heater that is operative to apply a vacuum suction force to hold the die, and a collet vacuum suction hole on the bond head heater that is operative to apply a vacuum suction force to hold the collet; and
   at least one vacuum distribution channel formed on the second side of the collet that is in fluid communication with the collet vacuum suction hole, said at least one vacuum distribution channel being operative to distribute the vacuum suction force across a surface of the second side of the collet for securing the collet.

2. The bond head as claimed in claim 1, wherein the second side of the collet is in direct contact with a surface of the bond head heater.

3. The bond head as claimed in claim 2, wherein the surface of the bond head heater which is in contact with the collet does not include any vacuum grooves connected to the collet vacuum suction hole.

4. The bond head as claimed in claim 1, wherein the at least one vacuum distribution channel comprises at least one vacuum groove patterned on the surface of the collet.

5. The bond head as claimed in claim 1, wherein the first side of the collet includes a network of vacuum grooves on the surface of the collet which are in fluid communication with the die vacuum suction hole on the bond head heater.

6. The bond head as claimed in claim 5, wherein the collet includes a central suction hole aligned with the die vacuum suction hole on the bond head heater for connecting the network of vacuum grooves with the die vacuum suction hole.

7. The bond head as claimed in claim 1, wherein the at least one distribution channel extends close to edges of the collet for an increased distribution of a vacuum suction force from the collet vacuum suction hole for securing the collet.

8. A collet for a bond head for thermal compression die bonding, the collet comprising:
a first side operative to support a die during die bonding;
a second side opposite to the first side for coupling the collet to a bond head heater which is configured to heat the collet and the die, the bond head heater having a die vacuum suction hole that is operative to apply a vacuum suction force to hold the die, and a collet vacuum suction hole that is operative to apply a vacuum suction force to hold the collet; and
at least one vacuum distribution channel formed on the second side of the collet that is arranged for fluid communication with the collet vacuum suction hole, said at least one vacuum distribution channel being operative to distribute the vacuum suction force across a surface of the second side of the collet for securing the collet.

9. The collet as claimed in claim 8, wherein the second side of the collet is configured to be in direct contact with a surface of the bond head heater.

10. The collet as claimed in claim 8, wherein the at least one vacuum distribution channel comprises at least one vacuum groove patterned on the surface of the collet.

11. The collet as claimed in claim 8, wherein the first side of the collet includes a network of vacuum grooves on the surface of the collet which are arranged to be in fluid communication with the die vacuum suction hole on the bond head heater.

12. The collet as claimed in claim 11, wherein the collet includes a central suction hole which is aligned with the die vacuum suction hole on the bond head heater for connecting the network of vacuum grooves with the die vacuum suction hole.

13. The collet as claimed in claim 8, wherein the at least one distribution channel extends close to edges of the collet for an increased distribution of a vacuum suction force from the collet vacuum suction hole for securing the collet to the bond head heater.

* * * * *